(12) United States Patent
Aggarwal et al.

(10) Patent No.: US 7,993,057 B2
(45) Date of Patent: Aug. 9, 2011

(54) REDUNDANT TEMPERATURE SENSOR FOR SEMICONDUCTOR PROCESSING CHAMBERS

(75) Inventors: Ravinder Aggarwal, Gilbert, AZ (US); Mark Kleshock, Phoenix, AZ (US); Loren Jacobs, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 451 days.

(21) Appl. No.: 11/961,671

(22) Filed: Dec. 20, 2007

(65) Prior Publication Data
US 2009/0159000 A1 Jun. 25, 2009

(51) Int. Cl.
*G01K 7/00* (2006.01)
(52) U.S. Cl. ............... 374/179; 374/141; 136/236.1; 136/227
(58) Field of Classification Search ............ 374/179, 374/141; 136/227, 236.1
See application file for complete search history.

(56) References Cited

U.S. PATENT DOCUMENTS

| | | | |
|---|---|---|---|
| 154,695 A | 9/1874 | Manly | |
| 3,011,006 A | 11/1961 | Nicholson | |
| 3,417,618 A | 12/1968 | Morrisette | |
| 4,075,036 A * | 2/1978 | Lysikov et al. | 136/225 |
| 4,377,347 A | 3/1983 | Hanmyo et al. | |
| 4,592,307 A | 6/1986 | Jolly | |
| 4,692,556 A | 9/1987 | Bollen et al. | |
| 4,976,996 A | 12/1990 | Monkowski et al. | |
| 4,978,567 A | 12/1990 | Miller | |
| 4,984,904 A | 1/1991 | Nakano et al. | |
| 5,027,746 A | 7/1991 | Frijlink | |
| 5,065,698 A | 11/1991 | Koike | |
| 5,104,514 A | 4/1992 | Quartarone | |
| 5,228,114 A | 7/1993 | Suzuki | |
| 5,246,500 A | 9/1993 | Samata et al. | |
| 5,271,967 A | 12/1993 | Kramer et al. | |

(Continued)

FOREIGN PATENT DOCUMENTS
EP 0 229 488 12/1986
(Continued)

OTHER PUBLICATIONS

International Preliminary Report on Patentability and Written Opinion, issued Jul. 1, 2010 in 7 pages, PCT Application No. PCT/US2008/080810, International Filing Date of Oct. 22, 2008.

(Continued)

*Primary Examiner* — Lisa Caputo
*Assistant Examiner* — Mirellys Jagan
(74) *Attorney, Agent, or Firm* — Knobbe, Martens, Olson & Bear LLP (57) ABSTRACT

Systems are provided for measuring temperature in a semiconductor processing chamber. Embodiments provide a multi-junction thermocouple comprising a first junction and a second junction positioned to measure temperature at substantially the same portion of a substrate. A controller may detect failures in the first junction, the second junction, a first wire pair extending from the first junction, or a second wire pair extending from the second junction. The controller desirably responds to a detected failure of the first junction or first wire pair by selecting the second junction and second wire pair. Conversely, the controller desirably responds to a detected failure of the second junction or second wire pair by selecting the first junction and first wire pair. Systems taught herein may permit accurate and substantially uninterrupted temperature measurement despite failure of a junction or wire pair in a thermocouple.

10 Claims, 5 Drawing Sheets

U.S. PATENT DOCUMENTS

| | | | |
|---|---|---|---|
| 5,315,092 A | 5/1994 | Takahashi et al. | |
| 5,336,327 A | 8/1994 | Lee | |
| 5,360,269 A | 11/1994 | Ogawa et al. | |
| 5,421,893 A | 6/1995 | Perlov | |
| 5,456,761 A | 10/1995 | Auger et al. | |
| 5,474,618 A | 12/1995 | Allaire | |
| 5,493,987 A | 2/1996 | McDiarmid et al. | |
| 5,514,439 A | 5/1996 | Sibley | |
| 5,562,774 A | 10/1996 | Breidenbach et al. | |
| 5,571,333 A | 11/1996 | Kanaya | |
| 5,788,799 A | 8/1998 | Steger et al. | |
| 5,902,407 A | 5/1999 | deBoer et al. | |
| 5,904,778 A | 5/1999 | Lu et al. | |
| 5,910,221 A | 6/1999 | Wu | |
| 6,056,823 A | 5/2000 | Sajoto et al. | |
| 6,066,209 A | 5/2000 | Sajoto et al. | |
| 6,120,640 A | 9/2000 | Shih et al. | |
| 6,129,808 A | 10/2000 | Wicker et al. | |
| 6,170,429 B1 | 1/2001 | Schoepp et al. | |
| 6,227,140 B1 | 5/2001 | Kennedy et al. | |
| 6,239,351 B1 * | 5/2001 | Hall, Jr. | 136/227 |
| 6,325,858 B1 * | 12/2001 | Wengert et al. | 118/725 |
| 6,342,691 B1 | 1/2002 | Johnsgard et al. | |
| 7,008,802 B2 | 3/2006 | Lu | |
| 7,166,165 B2 | 1/2007 | Halpin | |
| 2003/0035905 A1 | 2/2003 | Lieberman et al. | |
| 2005/0259719 A1* | 11/2005 | Phillips | 374/179 |
| 2006/0227849 A1* | 10/2006 | Phillips | 374/179 |
| 2007/0286255 A1* | 12/2007 | Toyoshima | 374/141 |
| 2008/0013598 A1* | 1/2008 | Perotti et al. | 374/179 |
| 2009/0052498 A1* | 2/2009 | Halpin et al. | 374/179 |
| 2009/0147819 A1* | 6/2009 | Goodman et al. | 374/1 |

FOREIGN PATENT DOCUMENTS

| | | |
|---|---|---|
| EP | 0 723 141 A1 | 7/1996 |
| GB | 1 236 601 | 6/1971 |
| JP | 5-64627 | 5/1993 |
| WO | WO 95/31582 | 11/1995 |
| WO | WO 97/06288 | 2/1997 |
| WO | WO 99/23276 | 5/1999 |
| WO | WO 01/11223 | 2/2001 |
| WO | WO 01/78115 | 10/2001 |

OTHER PUBLICATIONS

Introduction to Materials Science for Engineers, $3^{rd}$ Ed. James F. Shackelford, pp. 398, Macmillan Publishing Co. (1992).

Linke, J. and Vietzke, E., "Behavior of Boron Doped Graphites, Plasma Sprayed Boron Carbides and a-C/B:H as Plasma Facing Material," *J. Fusion Tech.* V.20, pp. 228-231 (Sep. 1991).

Ponnekanti et al., "Failure mechanisms of anodized aluminum parts used in chemical vapor deposition chambers," *J. Vac. Sci. Technol.* A 14(3) (May 1, 1996).

"Thermocouples for Silicon Process Technologies," Vulcan Electric Company brochure.

"Thermocouples for the Semiconductor Industry" Engelhard Corporation brochure (2004).

* cited by examiner

REDUNDANT TEMPERATURE SENSOR FOR SEMICONDUCTOR PROCESSING CHAMBERS

BACKGROUND

1. Field

The present invention relates to processing substrates in semiconductor processing chambers, and more particularly to temperature sensors configured to enhance accuracy of temperature control and to reduce downtime in the reactor.

2. Description of the Related Art

High-temperature processing chambers are used for depositing various material layers onto semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. If the deposited layer has the same crystallographic structure as the underlying silicon wafer, it is called an epitaxial layer. This is also sometimes called a monocrystalline layer because it has only one crystal structure. Through subsequent processes, these layers are made into integrated circuits, with a single layer producing from tens to thousands or even millions of integrated devices, depending on the size of the wafer and the complexity of the circuits.

Various process parameters must be carefully controlled to ensure the high quality of the resulting layers. One such critical parameter is the temperature of the wafer during each treatment step of the processing. During CVD, for example, the deposition gases react at particular temperatures and deposit on the wafer. If the temperature varies across the surface of the wafer, uneven deposition of the reactant gas occurs. Accordingly, it is important that wafer temperature be stable and uniform at the desired temperature before the treatment begins.

Similarly, non-uniformity or instability of temperatures across a wafer during other thermal treatments can affect the uniformity of resulting structures. Other processes for which temperature control can be critical include oxidation, nitridation, dopant diffusion, sputter depositions, photolithography, dry etching, plasma processes, and high temperature anneals.

Known methods and systems for processing wafers use thermocouples and other temperature sensors in various configurations within the processing chamber to regulate and control the temperature therein. For example, U.S. Pat. No. 6,596,973 to Donald et al. discloses a wafer temperature estimator that includes a thermocouple below the wafer and an optical pyrometer in a direct line of sight with the wafer. Another example is U.S. Pat. No. 6,121,061 to Van Bilsen, which teaches a plurality of temperature sensors measuring the temperature at various points surrounding the wafer, including a thermocouple placed near the leading edge of the wafer, another near the trailing edge, one at a side, and another below the wafer.

However, known systems and methods for measuring and controlling temperatures inside processing chambers have been found to deteriorate in their accuracy over time or fail altogether. These deteriorations and premature failures lead to reduced quality of depositions or unanticipated downtime for the processing chamber in order to make repairs or costly replacements. Moreover, there is significant time and expense in returning the reactor to the operating conditions necessary to produce the desired film properties on the wafers being coated. Accordingly, a system is needed that enhances accuracy of temperature control and reduces downtime and repairs in the reactor.

SUMMARY OF THE INVENTION

In one embodiment, a temperature control system is provided for controlling temperature in a semiconductor processing chamber. The system comprises a controller and a multi-junction thermocouple in communication with the controller. The multi-junction thermocouple comprises a first junction positioned to measure temperature at a portion of a substrate, a first wire pair extending from the first junction, a second junction positioned to measure temperature at substantially the same portion of the substrate, and a second wire pair extending from the second junction.

In another embodiment, a multi-junction thermocouple is provided for use in a semiconductor processing chamber. The multi-junction thermocouple comprises a first junction, a first wire pair joined at the first junction, a second junction disposed less than 1 mm from the first junction, and a second wire pair joined at the second junction.

In another embodiment, a temperature detection system is provided. The system includes a thermocouple and a controller for determining a temperature measurement from the thermocouple. The thermocouple includes a junction and a first conductor coupled to the junction, the first conductor being formed of a first material. The thermocouple further includes second and third conductors coupled to the junction, the second and third conductors being formed of a second material different than the first material. The controller is configured for monitoring the first, second, and third conductors and for detecting a failure in at least one of the conductors.

In another embodiment, a semiconductor processing apparatus is provided. The apparatus comprises a reaction chamber, a susceptor for supporting a substrate within the chamber, a shaft assembly for supporting the susceptor, and a multi-junction thermocouple. The multi-junction thermocouple comprises a first junction positioned to measure temperature at a portion of a substrate, and a second junction positioned to measure temperature at substantially the same portion of the substrate.

In another embodiment, a method of measuring temperature in a semiconductor processing chamber is provided. The method includes providing a multi-junction thermocouple inside the chamber, the multi-junction thermocouple comprising a first junction, a first wire pair operatively connected to the first junction, a second junction disposed within 1 mm of the first junction, and a second wire pair operatively connected to the second junction. The method also includes receiving temperature measurements from the multi-junction thermocouple, wherein the measurements can be selectively received from the first junction, the second junction, or both of the junctions.

All of these embodiments are intended to be within the scope of the invention herein disclosed. These and other embodiments of the present invention will become readily apparent to those skilled in the art from the following detailed description having reference to the attached figures, the invention not being limited to any particular embodiment(s) disclosed.

DETAILED DESCRIPTION

As noted above, known systems for temperature-controlled processing chambers are subject to failures that result in downtime for the reactor and significant costs for replacement components. In addition, there is significant time and expense in returning the reactor to the operating conditions necessary to produce the desired film properties on the wafer being coated. Replacing thermocouples and other components requires an intrusion into the chamber, which can result in undesirable particle generation. The methods and systems taught herein alleviate many of these problems.

While embodiments are described in the context of a cold wall CVD reactor for processing semiconductor wafers, it will be understood that the processing methods described herein will have utility in the context of reactors of other types. In particular, one of skill in the art can find applications for the methods described herein for other semiconductor processing equipment, wherein a semiconductor substrate is to be treated at a controlled temperature. The present invention can also be implemented in conjunction with other heating/cooling systems, such as those employing inductive or resistive heating. Moreover, precise temperature control is often required in the treatment of other substrates, including, without limitation, the deposition of optical thin films on glass or other substrates.

Figure 1:
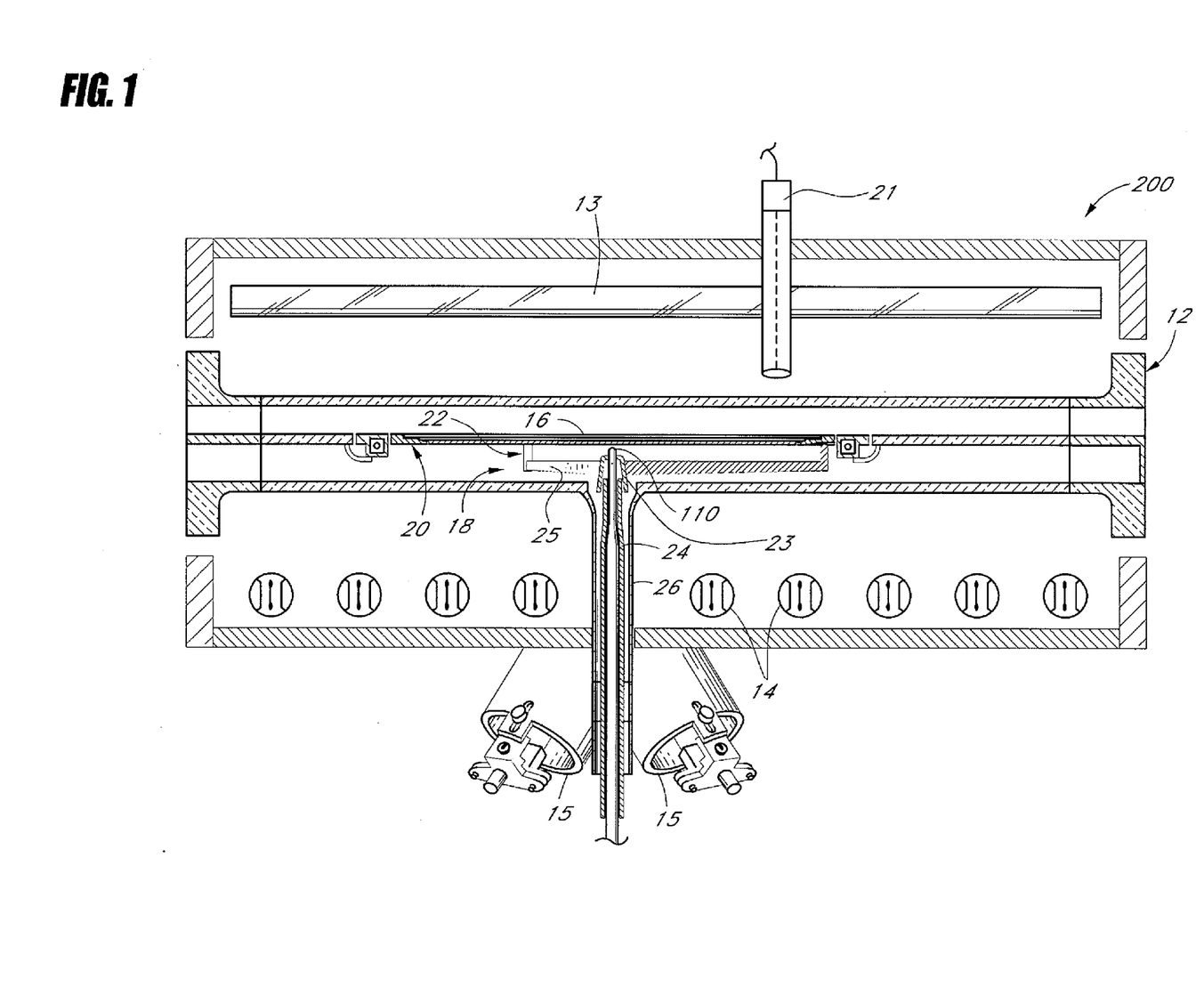
FIG. 1 is a cross-sectional view of a processing chamber in accordance with embodiments of the present invention.

FIG. 1 is a cross-sectional view of a processing chamber in accordance with an embodiment. The processing chamber 200 may include a quartz reaction chamber 12. A plurality of radiant heat sources (which, in the illustrated embodiment, comprise banks of heat lamps 13, 14) are supported outside of the chamber 12, to provide heat energy to the chamber 12 without appreciable absorption by the quartz chamber walls. Additionally, a plurality of spot lamps 15 supply concentrated heat to the underside of the wafer support structure 18 to counteract a heat sink effect created by cold support structures extending through the bottom of the reaction chamber 12.

A wafer 16 is shown supported within the reaction chamber 12 upon a wafer support structure 18. The illustrated support structure 18 includes a susceptor 20, upon which the wafer 16 rests, and a support spider 22. The support spider 22 is mounted to a shaft 24, which extends downwardly through a tube 26 depending from the chamber 12 lower wall.

Figure 2:
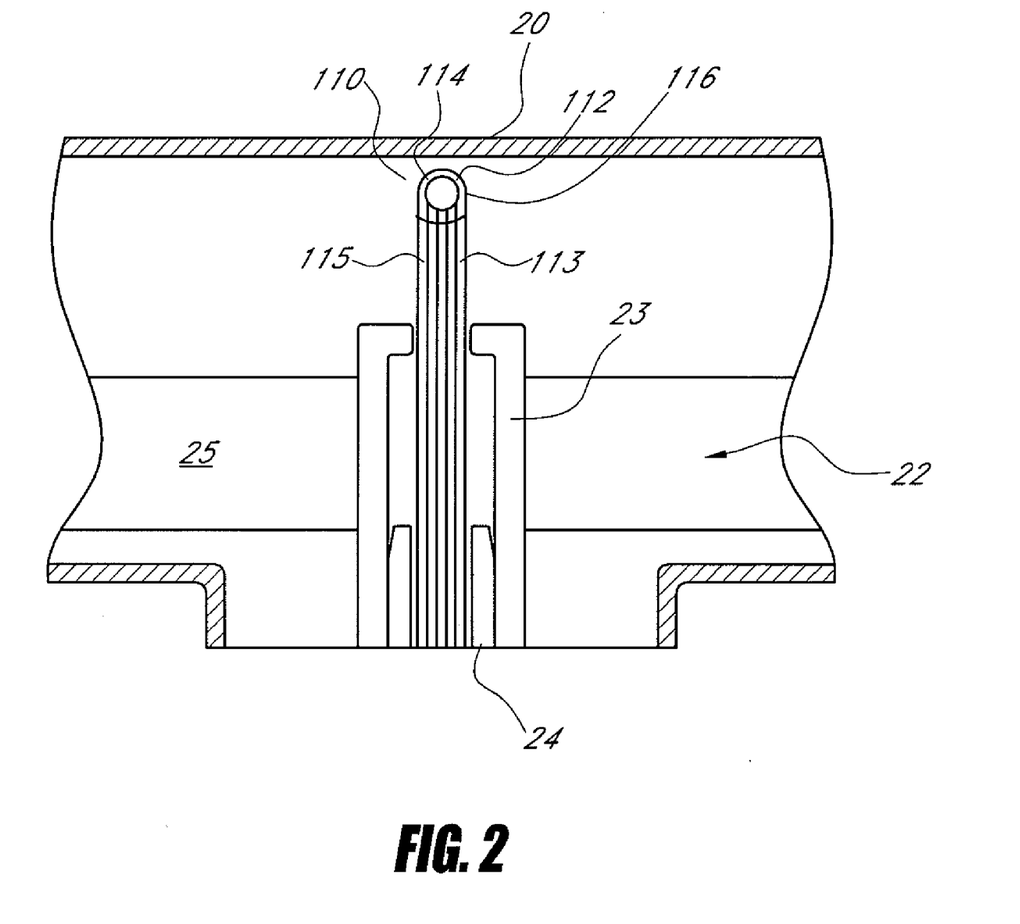
FIG. 2 is an enlarged cross-sectional view of the chamber of FIG. 1.

As is shown more clearly in the close-up view of FIG. 2, a multi-junction thermocouple 110 is in proximity to a central portion of the susceptor 20. In other embodiments, the multi-junction thermocouple 110 can be in other locations in the reaction chamber 12, such as near the leading edge, the trailing edge, or a side edge of the wafer 16 (FIG. 1). The multi-junction thermocouple 110 includes first and second junctions 112, 114 and first and second wire pairs 113, 115 which pass through the spider 22 and the shaft 24. In the illustrated embodiment, the spider 22 includes a socket 23 that receives the shaft 24, and a plurality of spider arms 25 extending generally radially outward and upward from the socket 23 to support the susceptor 20. In the embodiments shown in FIGS. 1 and 2, the first and second junctions 112, 114 are vertically positioned between the wafer 16 and the shaft 24 and radially positioned within 1 millimeter of the vertical center axis of the wafer 16. However, other configurations may be used to measure temperature at different locations of the substrate 16, such as at the leading edge, the trailing edge, the side edges, or any other position.

Figure 3:
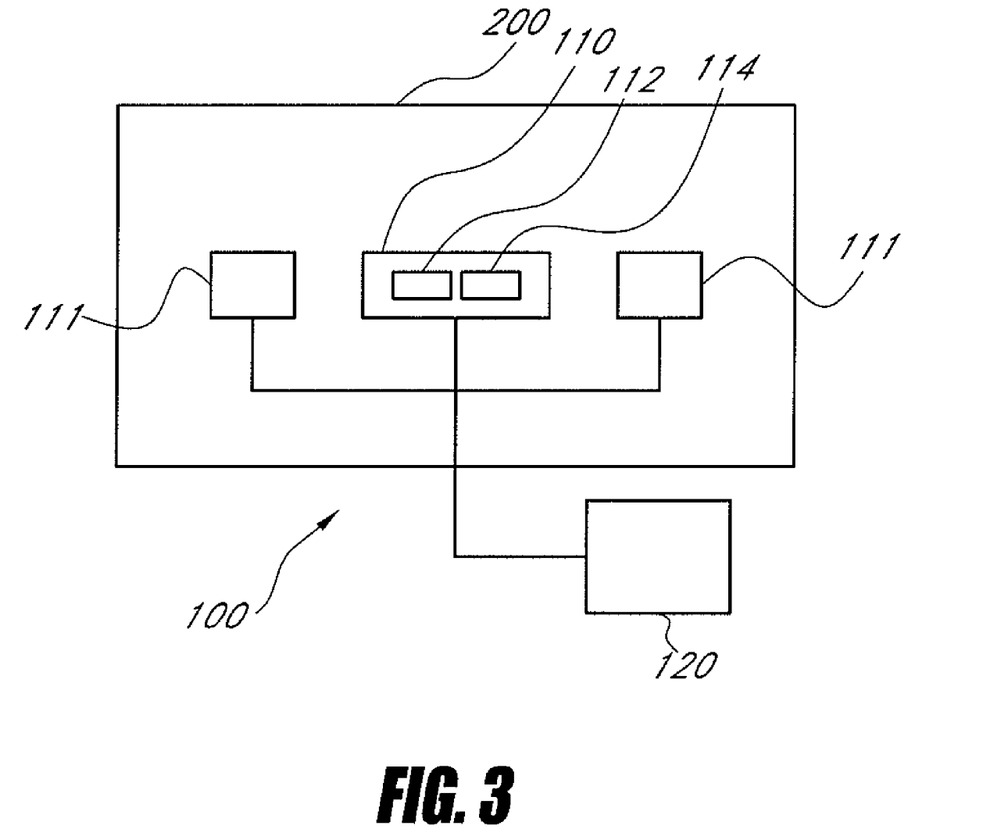
FIG. 3 is a schematic illustration of a temperature control system in accordance with embodiments of the invention.

FIG. 3 is a schematic illustration of a temperature control system 100 in accordance with embodiments of the invention. The temperature control system 100 includes a multi-junction thermocouple 110 inside a processing chamber 200. The processing chamber 200 is configured to carry out deposition on a substrate. As is well known, a thermocouple senses temperature at a junction by measuring the difference in voltage generated by two different conductors extending from the junction to another reference point. The thermal gradient between the junction and the reference point causes each conductor to generate a voltage. Because different conducting materials produce different voltages when exposed to the same temperature gradient, linking dissimilar conductors at the junction sets up a voltage difference between the two conductors at the reference point. In other words, the voltage difference between the junction and the end of the first wire at the reference point is not equal to the voltage difference between the junction and the end of the second wire at the reference point. Measurement of the voltage difference between the first and second wire at the reference point enables calculation of the temperature difference between the junction and the reference point.

A thermocouple is sometimes referred to as a contact-type sensor because it is frequently placed in contact with the article where temperature is to be sensed. However, it is sometimes positioned slightly spaced from that article. Thermocouples may be contact-type sensors, sensors that are spaced apart from the article to be sensed, and like thermal measuring devices known to those skilled in the art. Thus, a thermocouple measuring temperature at a portion of a substrate may be positioned near that portion rather than precisely at that portion of the substrate. For example, a thermocouple measuring temperature at the center of the substrate may be positioned below the susceptor supporting the substrate, such as about 6.4 mm below the substrate. As another example, a thermocouple measuring temperature at an edge of the substrate may be positioned adjacent to the substrate but not actually contacting the substrate, such as about 12.7 mm to about 25.4 mm from the substrate.

As shown in FIG. 3, the multi-junction thermocouple 110 comprises a first junction 112 and a second junction 114. The first and second junctions 112, 114 may each be formed by joining any two conductors suitable for detection of temperature in a semiconductor processing chamber environment. As noted above with reference to FIG. 2, the two conductors joined at the first junction 112 are the first wire pair 113, and the two conductors joined at the second junction 114 are the second wire pair 115. For example, so-called Type R thermocouples can be used, which comprise one wire of platinum (Pt) and another of platinum alloyed with about 13% rhodium (Rh). Of course, a variety of other types of thermocouples can be used, keeping in mind the goal of withstanding the environment within the reactor, such as temperatures as high as about 1200° C. For example, some possible thermocouple types that can be used include, without limitation, Type S (one wire formed of Pt, and another wire formed of 90% Pt and 10% Rh), Type B (one wire formed of 94% Pt and 6% Rh, and another wire formed of 70% Pt and 30% Rh), Type K (one wire formed of 90% nickel (Ni) and 10% chromium (Cr), and another wire formed of 95% Ni, 2% manganese (Mn), 2% aluminum (Al), and 1% silicon (Si)), and Type N (one wire formed of Ni, Cr, and Si, and another wire formed of Ni and Si).

The first junction 112 is positioned inside the processing chamber 200 at a position where it can measure temperature at a preselected location of the wafer 16 (FIG. 1). The second junction 114 is positioned to measure temperature at substantially the same location of the substrate. For example, the first and second junctions 112, 114 may be positioned to measure temperature at the center of the wafer 16. In such arrangements, the first and second junctions 112, 114 may be disposed near the center of the wafer, such as within a radius of one millimeter of the center of the substrate. As noted above, the first and second junctions 112, 114 may be positioned to measure temperature at other locations of the wafer 16 as well, such as at the leading edge, the trailing edge, other portions of the edge, or at locations between the center and the edge of the wafer 16.

In order to promote temperature measurement at substantially the same portion of the wafer, the first and second junctions 112, 114 may be disposed very close to one another, such as within one millimeter of each other, particularly within 0.5 millimeters of each other, more particularly within 0.25 millimeters of each other. In some embodiments, the first and second junctions 112, 114 are coincident with each other. In other embodiments not shown in the figures, the multi-junction thermocouple 110 may include more than two junctions all in close proximity with one another.

Other temperature sensors 111 can also be used inside the reaction chamber 200. These other temperature sensors 111 can include other thermocouples, contact-type sensors, pyrometers, or other types of temperature sensors suitable for detection of temperature in a semiconductor processing chamber environment. The other temperature sensors 111 can be positioned to measure temperature near the same portion of the wafer as the thermocouple 110. In other embodiments, the other temperature sensors 111 are positioned to detect temperature at different portions of the wafer than the thermocouple 110 and a controller 120 can estimate the temperature at the portion near the thermocouple 110 based on the readings from the other temperature sensors 111. The estimates can be calculated by interpolation or extrapolation, or by comparing the readings from other temperature sensors 111 to the readings from previous simulations in which an accurate reading was obtained for the same portion of the wafer where the thermocouple 110 is located. In this way, the other temperatureسنsors 111 can be used to produce a temperature measurement against which the reading from the thermocouple 110 can be compared, as described below.

In an embodiment illustrated in FIG. 3, the thermocouple 110 is in communication with a controller 120. The controller 120 can include a processor, particularly a programmable processor. The controller 120 receives measurements from the multi-junction thermocouple 110. In some embodiments, the controller 120 also receives measurements from other temperature sensors 111 inside the reaction chamber 200. In other embodiments, the controller only receives measurements from the multi-junction thermocouple 110, and not from other temperature sensors 111. Based on these measurements, the controller 120 adjusts heat inputs into the processing chamber 200. In some embodiments, in receiving measurements from the multi-junction thermocouple 110, the controller 120 is configured, such as by programming a processor in the controller 120, to selectively receive measurements from the first junction 112 and to ignore measurements from the second junction 114 under normal operating conditions, until a failure is detected in the first junction 112. In other embodiments, under normal operating conditions, the controller 120 selectively receives measurements from the second junction 114 and ignores measurements from the first junction 112 until there is a failure in the second junction 114. In still other embodiments, under normal operating conditions, the controller receives measurements from both the first and second junctions 112, 114 and combines the measurements, such as by averaging the measurements, until a failure is detected in one of the junctions 112, 114. In embodiments where the controller 120 receives measurements from the first junction 112 and second junction 114, the controller 120 can detect failures in the first junction 112 and/or first wire pair 113, or alternatively in the second junction 114 and/or second wire pair 115, by comparing the measurements it receives from the first junction 112 with measurements it receives from the second junction 114. In embodiments where the controller 120 receives measurements from other temperature sensors 111, the controller 120 can detect failures of junctions 112, 114 or wire pairs 113, 115 by comparing measurements from the junctions with measurements from said sensors 111.

A thermocouple junction can fail when the junction itself fails or when there is a failure in any of the circuitry connecting the junction with the controller. As used herein, failure includes deterioration in the accuracy of the reading, such as temperature drift, as well as an inability to provide a reading, such as when a junction fails to communicate with the processor due to an open circuit. While a reading that is inaccurate by only a fraction of a degree Celsius is not considered a failure, a reading that is inaccurate by 1° C. or more often is a failure, depending upon the sensitivity of the process that is being run. In an open circuit mode of failure, the detection of failure can be made by a component other than the aforementioned controller, such as in a multiplexer between the thermocouple and the controller.

In the case of an open circuit, the controller 120 can detect failure in a junction simply by recognizing that no current is flowing from that junction. In the case of an erroneous reading, the controller 120 can detect failure by comparing the measurements from one of the junctions 112, 114 with the measurements from the other junction, or by comparing the measurements from one of the junctions 112, 114 with the measurements from other temperature sensors 111. If there is a substantial difference in the measurements, such as a difference of 1° C. or more, the controller 120 can determine that one of the junctions has failed. When the determination of a failure only involves a comparison of the measurements from the first junction with the second junction, in some embodiments this determination of a failure can be done by a component other than the controller 120, such as in a multiplexer. The controller 120 may then use information from other sources, such as measurements from other temperature sensors 111 in the processing chamber 200, to determine which of the junctions 112, 114 or wire pairs 113, 115 has failed. In using information from other temperature sensors 111, the controller 120 may carry out calculations to take into account the location of the other temperature sensors as compared to the junctions 112, 114.

In embodiments involving thermocouple junctions 112, 114, when the controller 120 detects a failure in either junction or associated wire pair 113, 115, the controller 120 can ignore the failed junction/wire pair for process control purposes and perform its control functions using only the junction/wire pair that has not failed. In other words, the controller 120 no longer uses measurements from the failed junction/wire pair but processing of the wafer can continue unabated. In this application, in embodiments involving a pair of junctions, the "selection" of a junction comprises ignoring the failed junction/wire pair for process control purposes and using measurements from the non-failed junction/wire pair, wherein the "selected" junction is the non-failed junction/wire pair. For example, in embodiments where the controller 120 adjusts heat input into the processing chamber 200 based on measurements from both junctions 112, 114, the controller 120 can select the second junction 114 if it detects a failure in the first junction 112 or first wire pair 113. After selecting the second junction 114, the controller adjusts heat input into the processing chamber 200 based on measurements from the second junction 114 and not the first junction 112.

In some embodiments, the controller 120 can continue to receive measurements from the first junction 112 even after selecting the second junction 114 in order to monitor whether the failure in the first junction 112 or first wire pair 113 has ended. Nonetheless, the controller 120 will not consider measurements it receives from the first junction 112 after it has selected the second junction 114 unless the controller 120 determines that the failure of the first junction 112 or first wire pair 113 has ended. The processes for determining whether a failure of a junction or wire pair has ended are similar to the processes described above for detecting a failure, e.g., by comparing measurements from the junction in question to measurements from other temperature sensors. The controller 120 is preferably configured to detect failure in a junction or wire pair and select the other junction without significantly interrupting processing in the processing chamber 200. Thus, in the temperature control system 100, even when one of the junctions 112, 114 (or associated wire pairs 113, 115) in the multi-junction thermocouple 110 fails, temperature detection and control in the reaction chamber 200 can continue without halting the processing in the chamber 200 to replace the failed thermocouple junction/wire pair. As skilled artisans will understand, replacing a thermocouple typically involves exposing the chamber 200 to ambient air, which necessitates a subsequent purging of the chamber to remove contaminants. All of this takes time. As such, the temperature control system 100 having redundant junctions can advantageously reduce chamber down time and expense in returning the chamber 200 to desired operation conditions.

Figure 4A:
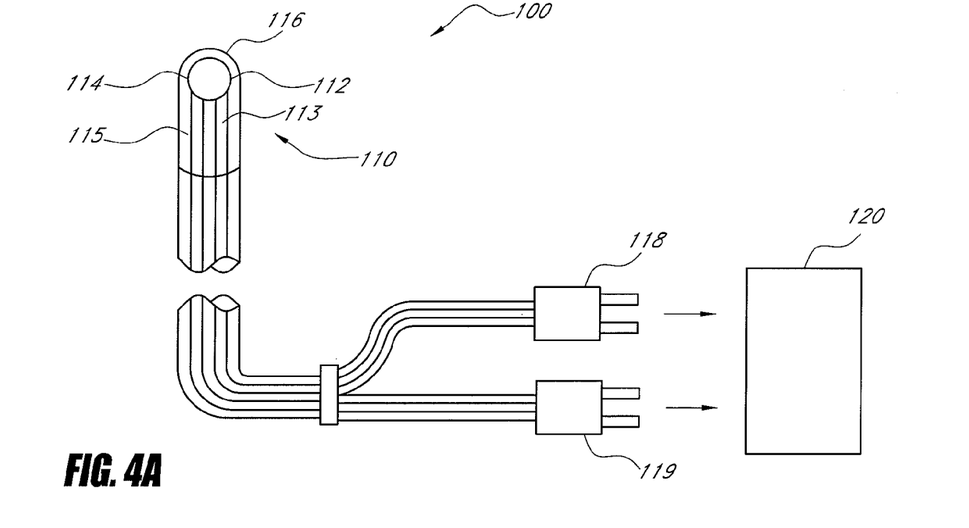
FIG. 4A is a schematic illustration of a multi-junction thermocouple in accordance with embodiments of the invention.
Figure 4B:
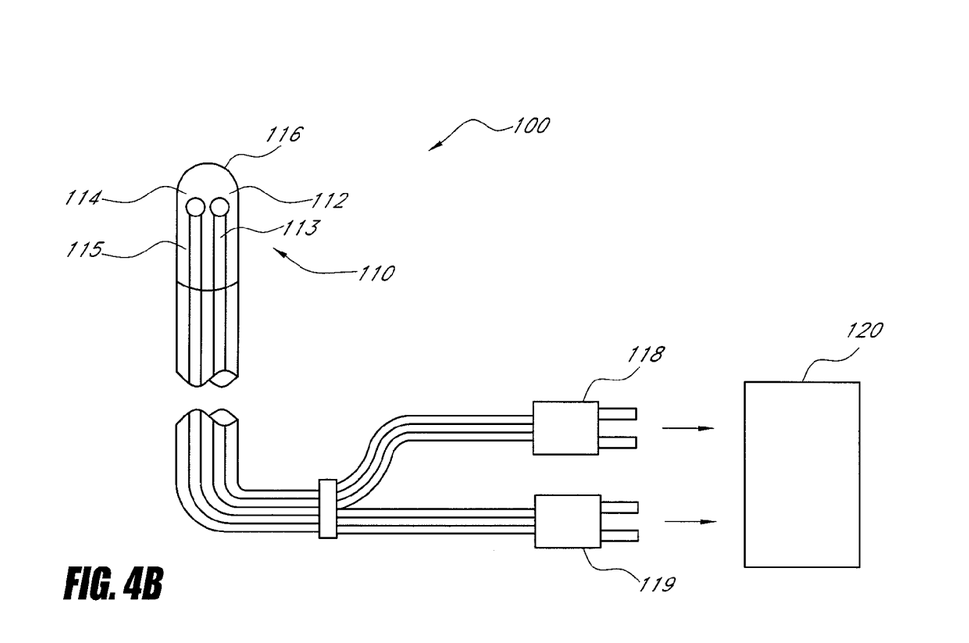
FIG. 4B is a schematic illustration of a multi-junction thermocouple in accordance with other embodiments of the invention.

FIGS. 4A and 4B are schematic illustrations of thermocouples in accordance with embodiments. In the embodiment shown in FIG. 4A, the first junction 112 and the second junction 114 are coincident. In the embodiment shown in FIG. 4B, the first junction 112 and the second junction 114 are disposed very near each other, such as within one millimeter of each other, particularly within 0.5 millimeters of each other, more particularly within 0.25 millimeters of each other. The first junction 112 is in communication with the processor 120 via a first wire pair 113 and a first junction connector 118. The first wire pair 113 can comprise a combination of two different types of electrical conductors that generate different voltages when exposed to the same temperature gradient. As noted above, an exemplary combination includes one wire formed of Pt and another wire formed of Pt alloyed with about 13% rhodium, commonly known as a Type R thermocouple. The second junction 114 communicates with the processor 120 through the second wire pair 115 and the second junction connector 119. The second wire pair 115 can be formed in the same way as described above with respect to the first wire pair 113. Alternatively, the second wire pair 115 can be made from another set of conductors as the conductors of the first wire pair 113. For example, the first wire pair can be Type R and the second wire pair can be Type B.

The first and second junctions 112, 114 may be protected by a covering 116. The covering 116 may comprise a sheath made of quartz or other vitreous or non-vitreous materials. To further protect the thermocouple 110, the covering 116 may comprise a coating formed over the sheath. The coating can create a barrier between the sheath and the environment within the chamber. A coating can be very thin, such as having a thickness between approximately 500 to 5000 Å, particularly 1500 to 2500 Å. The coating may comprise a material that is more resistant to acids, high temperatures and thermal cycling than the material of the underlying sheath. For example, the coating may comprise silicon carbide and/or silicon nitride. The coating may be formed by any process that is capable of forming a thin barrier layer with good adhesion to the underlying sheath. For example, in some embodiments, the coating can be formed by a sputter process. In other embodiments, the coating can be formed by a chemical vapor deposition process. Sheaths and coatings that can be used in conjunction with the covering 116 for protecting the thermocouple 110 are more fully described in paragraphs [0028]-[0035] of U.S. Patent Application Publication No. 2002/001121 entitled "BARRIER COATING FOR VITREOUS MATERIALS," filed Apr. 6, 2001, which paragraphs are hereby incorporated by reference herein.

Figure 5:
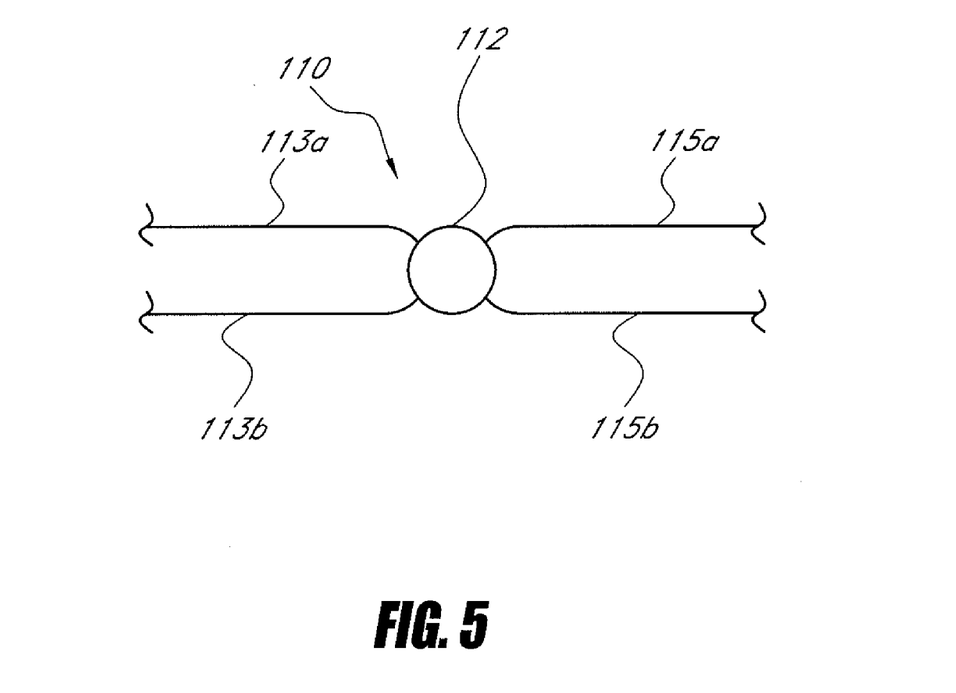
FIG. 5 is a schematic illustration of a thermocouple in accordance with other embodiments of the invention.

FIG. 5 is a schematic illustration of a thermocouple in accordance with certain embodiments. The thermocouple 110 shown in FIG. 5 includes a single junction 112, a first conductor 113a, a second conductor 113b, a third conductor 115a, and a fourth conductor 115b. In the embodiment shown in FIG. 5, the first and third conductors 113a, 115a are the same kind of conductor, i.e., they are formed of the same material. The second and fourth conductors 113b, 115b are also the same kind of conductor as each other, i.e., formed of the same materials, but different than the conductors 113a, 115a. For example, conductors 113a, 115a can be wires formed of Pt, while conductors 113b, 115b may be wires formed of Pt and Rh.

In the arrangement shown in FIG. 5, a temperature measurement can be obtained from the thermocouple 110 in four different ways: by comparing the voltage across the first conductor 113a with the voltage across the second conductor 113b; by comparing the voltage across the first conductor 113a with the voltage across the fourth conductor 115b; by comparing the voltage across the third conductor 115a with the voltage across the second conductor 113b; and by comparing the voltage across the third conductor 115a with the voltage across the fourth conductor 115b.

By comparing the readings from the conductors in each of these four ways, the controller 120 (FIGS. 3 and 4) can detect which specific conductor has failed. Once a failure is detected, the controller 120 can ignore the failed conductor while continuing to receive measurements from the other conductors. Even after one of the conductors has failed, the thermocouple 110 of FIG. 5 can still provide redundancy. For example, if the controller 120 detected that the first conductor 113a failed, a temperature measurement could still be obtained in two ways: by comparing the voltage across the third conductor 115a with the voltage across the second conductor 113b; and by comparing the voltage across the third conductor 115a with the voltage across the fourth conductor 115b. Skilled artisans will appreciate that these principles can be applied in a thermocouple having more than four conductors, thereby achieving greater redundancy.

Figure 6:
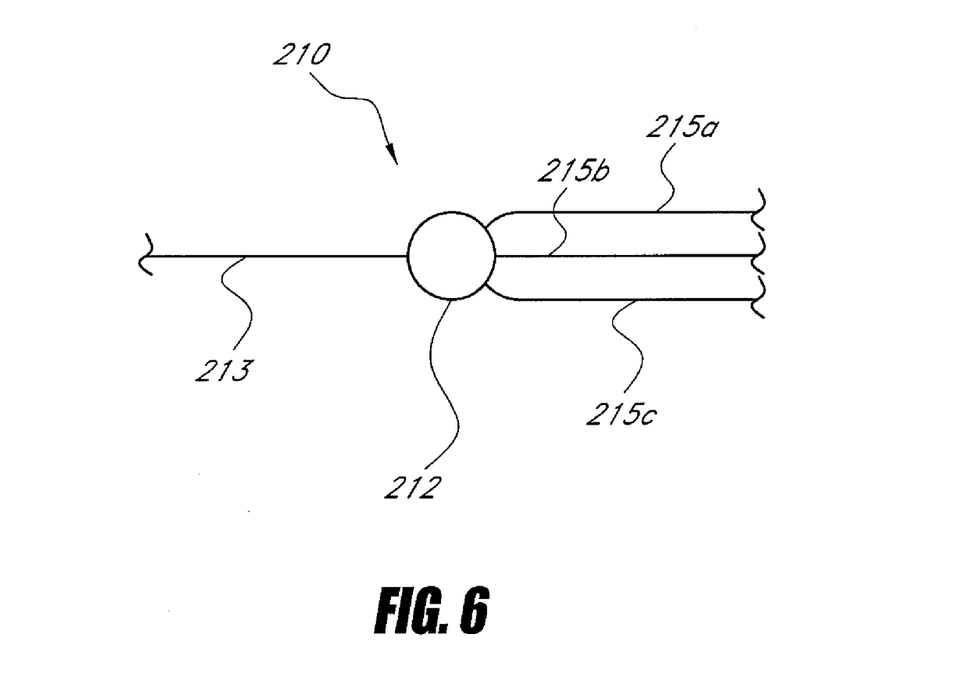
FIG. 6 is a schematic illustration of a thermocouple in accordance with other embodiments of the invention.

FIG. 6 illustrates a thermocouple 210 that offers redundancy in a different way. The thermocouple 210 includes a junction 212, a first conductor 213, and second, third, and fourth conductors 215a, 215b, 215c. The second, third, and fourth conductors 215a, 215b, 215c are of the same kind as each other but are of a different kind than the first conductor 213. In other words, the conductors 215a, 215b, and 215c are preferably formed of the same material, which is preferably different than that of the conductor 213. The thermocouple of FIG. 6 has particular utility when one kind of conductor is known to fail more frequently than the other. The second, third, and fourth conductors 215a, 215b, 215c can be formed of the conductor material that is more likely to fail. In this way, if one of the conductors 215a, 215b, or 215c fails, the thermocouple 210 can still provide redundancy because the first conductor 213 can still be combined with the remaining two non-failed conductors. Further, if yet another of the conductors 215a, 215b, or 215c fails, the thermocouple 210 can still provide a temperature measurement by combining the first conductor 213 with the remaining non-failed conductor. It will be appreciated that any number of conductors 213 and 215 can be provided.

It will be appreciated by those skilled in the art that various modifications and changes may be made without departing from the scope of the invention. All such modifications and changes are intended to fall within the scope of the invention, as defined by the appended claims.

What is claimed is:

1. A temperature detection system comprising a thermocouple assembly, the thermocouple assembly comprising:
   a junction;
   a first conductor coupled to the junction, the first conductor being formed of a first material;
   second and third conductors coupled to the junction, the second and third conductors being formed of a second material different than the first material, wherein the second and third conductors are formed of the same second material; and
   a controller for determining a temperature measurement from the thermocouple assembly, wherein the controller is configured for monitoring the first, second and third conductors and for detecting a failure in at least one of the conductors, and wherein the controller is configured to respond to a detection of a failure of the first, second or third conductor by ceasing to use inputs from the failed conductor for determining a temperature measurement from the thermocouple assembly,
   wherein the first conductor and the second conductor form a first thermocouple therebetween, and the first conductor and the third conductor form a second thermocouple therebetween.

2. The temperature detection system of claim 1, further comprising a fourth conductor, wherein the fourth conductor is formed of the same second material as the second and third conductors, the fourth conductor being coupled to the junction.

3. The temperature detection system of claim 1, wherein the first material is platinum and the second material is platinum and rhodium.

4. The temperature detection system of claim 1, wherein the thermocouple assembly is configured for use in a semiconductor processing chamber.

5. A temperature control system for controlling temperature in a semiconductor processing chamber, comprising:
   a controller for controlling heat inputs into the processing chamber; and
   a thermocouple assembly in communication with the controller, the thermocouple assembly comprising:
   a junction;
   a first conductor coupled to the junction, the first conductor being formed of a first material; and
   second and third conductors coupled to the junction, the second and third conductors being formed of a second material different than the first material, wherein the second and third conductors are formed of the same second material;
   wherein the first conductor and the second conductor form a first thermocouple therebetween, and the first conductor and the third conductor form a second thermocouple therebetween, and
   wherein the controller is configured to detect a failure in at least one of the first and second thermocouples and to selectively use a non-failed thermocouple for controlling heat inputs into the processing chamber.

6. The temperature control system of claim 5, further comprising a fourth conductor, wherein the fourth conductor is formed of the same second material as the second and third conductors, the fourth conductor being coupled to the junction.

7. The temperature detection system of claim 5, wherein the first material is platinum and the second material is an alloy comprising platinum and rhodium.

8. A semiconductor processing apparatus, comprising:
   a reaction chamber;
   a susceptor disposed within the reaction chamber, wherein a substrate is supportable on the susceptor within the reaction chamber;
   a shaft assembly extending into the reaction chamber for supporting the susceptor; and
   a thermocouple assembly disposed at least partially within the shaft, the thermocouple assembly comprising:
   a junction located adjacent to the susceptor;
   a first conductor coupled to the junction, the first conductor being formed of a first material; and
   second and third conductors coupled to the junction, the second and third conductors being formed of a second material different than the first material, wherein the second and third conductors are formed of the same second material;
   wherein the first conductor and the second conductor form a first thermocouple therebetween, and the first conductor and the third conductor form a second thermocouple therebetween; and
   a controller for controlling heat inputs into the processing chamber, the thermocouple assembly being operatively connected to the controller such that the controller receives a temperature measurement from both the first and second thermocouples, and wherein the controller is configured to detect a failure in at least one of the first and second thermocouples and to selectively use a non-failed thermocouple for controlling heat inputs into the processing chamber.

9. The semiconductor processing apparatus of claim 8, further comprising a fourth conductor, wherein the fourth conductor is formed of the same second material as the second and third conductors, the fourth conductor being coupled to the junction.

10. The semiconductor processing apparatus of claim 8, wherein the first material is platinum and the second material is an alloy comprising platinum and rhodium.

* * * * *